United States Patent [19]

Matsuda et al.

[11] Patent Number: 5,568,147
[45] Date of Patent: Oct. 22, 1996

[54] DIGITAL-TO-ANALOG CONVERTER FOR REDUCING OCCUPIED AREA THEREOF

[75] Inventors: Atsushi Matsuda; Tachio Yuasa, both of Kawasaki, Japan

[73] Assignee: Fujitsu Limited, Kawasaki, Japan

[21] Appl. No.: 334,343

[22] Filed: Nov. 2, 1994

[30] Foreign Application Priority Data

Dec. 28, 1993 [JP] Japan ................... 5-336843

[51] Int. Cl.$^6$ .................................... H03M 1/68
[52] U.S. Cl. ........................... 341/154; 341/145
[58] Field of Search ................... 341/144, 145, 341/147, 148, 153, 154

[56] References Cited

U.S. PATENT DOCUMENTS

| | | | |
|---|---|---|---|
| 3,273,143 | 9/1966 | Wasserman | 341/154 |
| 4,742,329 | 5/1988 | Yamada et al. | |
| 5,126,740 | 6/1992 | Kawada | 341/154 |
| 5,252,975 | 10/1993 | Yuasa et al. | 341/145 |

FOREIGN PATENT DOCUMENTS

0521629A2  1/1993  European Pat. Off. .

Primary Examiner—Howard L. Williams
Attorney, Agent, or Firm—Armstrong, Westerman, Hattori, McLeland & Naughton

[57] ABSTRACT

A D/A converter has a first partial circuit, and second and third partial circuits connected with said first partial circuit. The first partial circuit has a first row of K resistors of the same resistance value and groups of switches provided for the resistors, to select "K-1" resistors among said K resistors and connect said selected resistors in series with said second and third partial circuits. The second partial circuit has a second row of L resistors, a first group of switches connected in series with said resistors, respectively, and a second group of switches connected in parallel with said series-connected second row of resistors and said first group of switches, respectively. The third partial circuit has a third row of L resistors, a third group of switches connected in series with said resistors, respectively, and a fourth group of switches connected in parallel with said series-connected third row of resistors and said third group of switches, respectively. Therefore, the D/A converter can reduces an occupied area thereof, and increases the number of D/A converter chips to be fabricated on a wafer, to thereby reduce the costs of the D/A converters.

12 Claims, 16 Drawing Sheets

DIGITAL-TO-ANALOG CONVERTER FOR REDUCING OCCUPIED AREA THEREOF

BACKGROUND OF THE INVENTION

1. Field of the Invention

The present invention relates to a digital-to-analog converter (hereinafter referred to as a D/A converter), and particularly, to a D/A converter for providing an output voltage Vout=Vin·X/$2^n$ in response to an input voltage Vin and an n-bit digital input X.

2. Description of the Related Art

Recently, digital technology is rapidly improved, and D/A converters are used in various fields. It is necessary, for large scale integrated circuits (LSIs), to minimize an area occupied by a D/A converter. To reduce the area, the D/A converter for providing an output voltage Vout=Vin·X/$2^n$ in response to the input voltage Vin and n-bit digital input X must employ small field-effect transistors (FETs) served as switching elements.

The problems of the prior art will be explained later with reference to the accompanying drawing and some equations.

SUMMARY OF THE INVENTION

An object of the present invention is to provide a small D/A converter employing small FET switches.

According to the present invention, there is provided a D/A converter for providing an analog output according to a digital input signal, comprising a first partial circuit, disposed between a first reference voltage input terminal and a second reference voltage input terminal, having a first row of K resistors of the same resistance value and groups of switches provided for the resistors, to select "K-1" resistors among the K resistors; a second partial circuit, connected with the first partial circuit, having a second row of L resistors, a first group of switches connected in series with the resistors, respectively, and a second group of switches connected in parallel with the series-connected second row of resistors and the first group of switches, respectively; and a third partial circuit, connected with the first partial circuit, having a third row of L resistors, a third group of switches connected in series with the resistors, respectively, and a fourth group of switches connected in parallel with the series-connected third row of resistors and the third group of switches, respectively.

The selected "K-1" resistors among the K resistors may be connected in series with the second and third partial circuits. The groups of switches of the first partial circuit may be controlled by higher bits of the digital input signal, and the first and second groups of switches of the second partial circuit and the third and fourth groups of switches of the third partial circuit may be controlled by lower bits of the digital input signal. The signals to control the first and fourth groups of switches may be inversions of the signals to control the second and third groups of switches.

An output terminal for providing the analog output may be arranged at a node between the second partial circuit and the third partial circuit. The D/A converter may further comprise a fourth partial circuit arranged between the second partial circuit and the third partial circuit, the fourth partial circuit having a fourth row of series-connected "M-1" resistors of the same resistance value and a fifth group of switches for selectively short-circuiting M ends of the resistors with respect to the output terminal for providing the analog output. The fifth group of switches of the fourth partial circuit may be controlled by intermediate bits of the digital input signal.

The first partial circuit may have resistors connected in parallel with the first-row resistors, respectively. The D/A converter may further comprise a resistor having a predetermined resistance value and arranged between the first partial circuit and the second partial circuit. The first partial circuit may be directly connected with the second partial circuit, so that the ON resistance of the groups of switches of the second and third partial circuits provides a predetermined resistance value between the first and second partial circuits.

The second partial circuit may be arranged between the first partial circuit and the first reference voltage input terminal, and the third partial circuit may be arranged between the first partial circuit and the second reference voltage input terminal. The D/A converter may further comprise a fourth partial circuit served as the first partial circuit, the fourth partial circuit having a fourth row of series-connected M-1 resistors of the same resistance value and a fifth group of switches for selectively short-circuiting M ends of the resistors with respect to an output terminal for providing the analog output.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

For a better understanding of the preferred embodiments, the problems of the prior art will be explained.

Figure 1A:
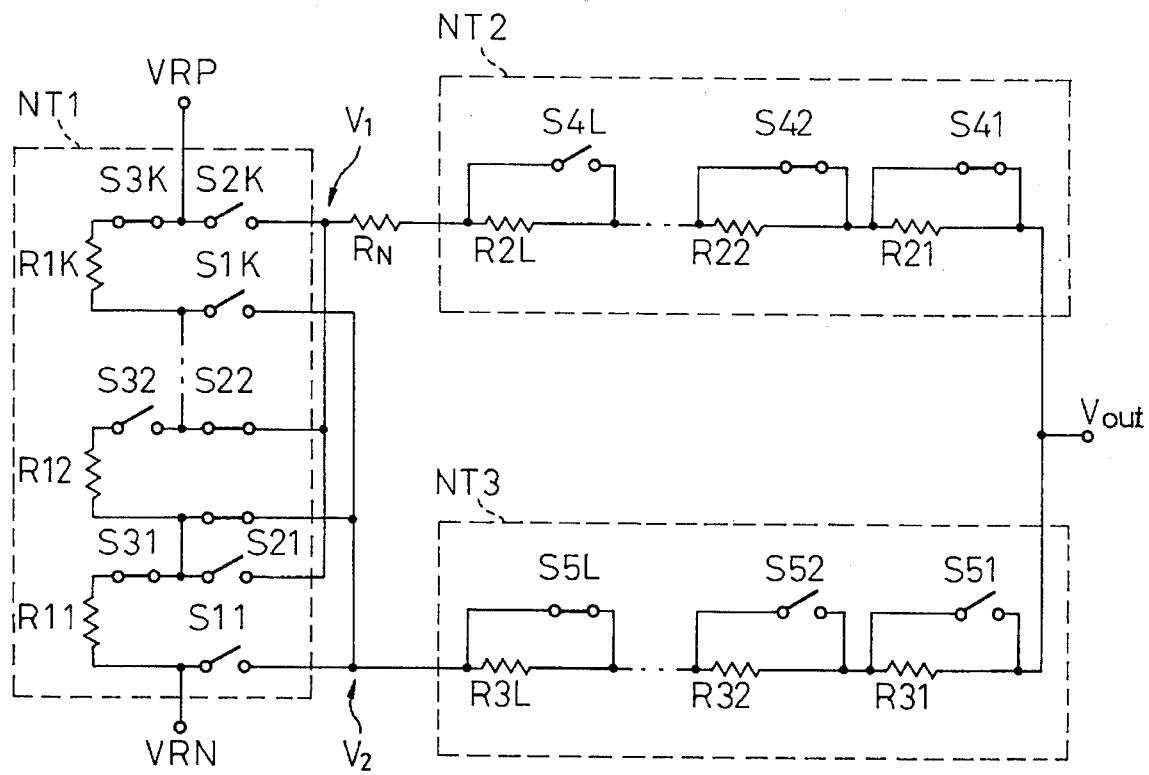
FIGS. 1A, 1B, and 1C are circuit diagrams showing a D/A converter according to the prior art.
Figures 1B, 1C:
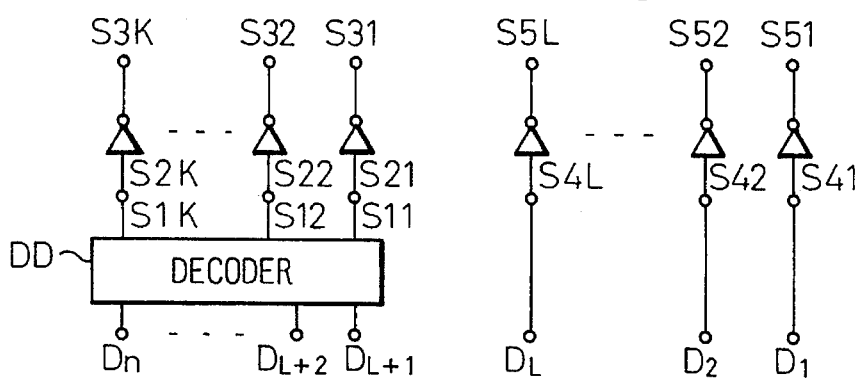

FIGS. 1A, 1B, and 1C shows a D/A converter according to the prior art, and this D/A converter provides an output voltage Vout=Vin·X/2ⁿ in response to the input voltage Vin and n-bit digital input X. Note that, FIG. 1A generally shows the D/A converter, and FIGS. 1B and 1C schematically show a circuit for generating signals to control switches of the D/A converter.

Referring to FIG. 1A, there are first, second, and third partial circuits NT1, NT2, and NT3. The first partial circuit NT1 is connected with the second partial circuit NT2 through a resistor $R_N$ and is directly connected with the third partial circuit NT3. A node connecting the second and third partial circuits NT2 and NT3 provides an output signal terminal Vout.

The first partial circuit NT1 has a first row of K resistors R11 to R1K of the same resistance value and groups of switches S11 to S1K, S21 to S2K, and S31 to S3K provided for the resistors R11 to R1K. The second partial circuit NT2 has a second row of L resistors R21 to R2L and a group of switches S41 to S4L provided for the resistors R21 to R2L, respectively. The third partial circuit NT3 has a third row of L resistors R31 to R3L and a group of switches S51 to S5L provided for the resistors R31 to R3L, respectively.

In the second partial circuit NT2, the switches S41 to S4L are connected in parallel with the resistors R21 to R2L, respectively. In the third partial circuit NT3, the switches S51 to S5L are connected in parallel with the resistors R31 to R3L, respectively.

Referring to FIG. 1C, the groups of switches S41 to S4L and S51 to S5L selectively short-circuit the second and third rows of resistors R21 to R2L and R31 to R3L in response to bits $D_1$ to $D_L$ of a digital input signal. The groups of switches S11 to S1K, S21 to S2K, and S31 to S3K select "K-1" pieces of the K resistors R11 to R1K in response to bits $D_{L+1}$ to $D_n$ of the digital input signal, so that the selected "K-1" resistors, resistor $R_N$N, second row of resistors R21 to R2L, and third row of resistors R31 to R3L are connected in series.

A reference mark VRP is a positive reference voltage input, VRN is a negative reference voltage input, and Vout is an analog output from the D/A converter. The D/A converter handles n bits with $K \cdot 2^L = 2^n$ where n is a natural number.

The operations of the D/A converter will be explained.

Referring to FIG. 1B, a decoder DD decodes higher bits $D_{L+1}$ to $D_n$ among bits $D_1$ to $D_n$ of an n-bit digital input signal and provides signals to control the switches S11 to S1K, S21 to S2K, and S31 to S3K. The signals to control the switches S31 to S3K are inversions of the signals to control the switches S11 to S1K (S21 to S2K). In FIG. 1C, the signals to control the switches S51 to S5L are inversions of the signals to control the switches S41 to S4L.

The higher-bit circuit, i.e., the first partial circuit NT1 provides output voltages V1 and V2 from positions selected by the switches. The output voltages V1 and V2 are expressed as follows:

$$V1 = \frac{VRP - VRN}{K} \cdot Y + VRN \quad (1)$$

$$V2 = \frac{VRP - VRN}{K} \cdot (Y - 1) + VRN$$

where, $Y \leq K$, and Y is a natural number.

The voltages V1 and V2 are provided to the lower-bit circuits, i.e., the second and third partial circuits NT2 and NT3.

The lower bits $D_1$ to $D_L$ of the digital input signal are used as they are and are inverted, to generate signals to control the switches S41 to S4L and S51 to S5L, respectively. The control signals select L pieces of the 2L switches, to open or short-circuit the each selected L switches. Namely, when a switch S4# is opened, a switch S5# is short-circuited, and when the switch S4# is short-circuited, the switch S5# is opened. Here, the reference mark # indicates one of natural numbers 1 to L.

The resistors R11 to R1K have a resistance value of $R_K$, the second-row resistors have each a resistance value of R2#, and the third-row resistors have each a resistance value of R3#. The resistance values R2# and R3# are expressed as follows:

$$R2\#, R3\# = R_K/2\# \quad (2)$$

The resistance value of the resistor $R_N$ is expressed as follows:

$$R_N = R_K/2^L \quad (3)$$

The expression (3) corresponds to the resistance value of the LSB. Accordingly, the total resistance value of the partial circuits NT2 and NT3 and the resistor $R_N$ is equal to the resistance value $R_K$ after the switches S4# and S5# are short-circuited or opened. Then, the analog output Vout is expressed as follows:

$$Vout = \frac{V1 - V2}{2^L}(Z - 1) + V2 \quad (4)$$

where, $Z \leq 2^L$, and Z is a natural number.

The equations (1) and (4) provide the following:

$$Vout = \frac{VRP - VRN}{K}\left(Y - 1 + \frac{Z-1}{2^L}\right) + VRN \quad (5)$$

When $X=(Y-1)2^L+Z-1$, $K \cdot 2^L = 2^n$, so that X is a digital input of the following value:

$$0 <= X <= 2^n - 1 \quad (6)$$

Accordingly, the circuit mentioned above operates as an n-bit D/A converter for providing an analog output Vout in response to a digital input X as follows:

$$Vout = (VRP - VRN)\frac{X}{2^n} + VRN \quad (7)$$

When the switch S4# or S5# is short-circuited, it provides ON resistance. The value "r" of the ON resistance must be as follows:

$$r << R2\#, R3\# \quad (8)$$

To achieve this, the size of each FET served as an analog switch in an LSI must be large.

The resistance value r of the switch S4# or S5# when short-circuited in the D/A converter of FIGS. 1A to 1C is preferably r<<R2#, R3#. To realize this, it is necessary to increase the size of FETs that serve as the 2L switches S41 to S4L and S51 to S5L. Increasing the FET size enlarges an area occupied by the D/A converter, thus reducing the number of D/A converter chips to be formed on a wafer and increasing the costs of the D/A converters.

Below, embodiments of a D/A converter according to the present invention will be explained.

Figure 2A:
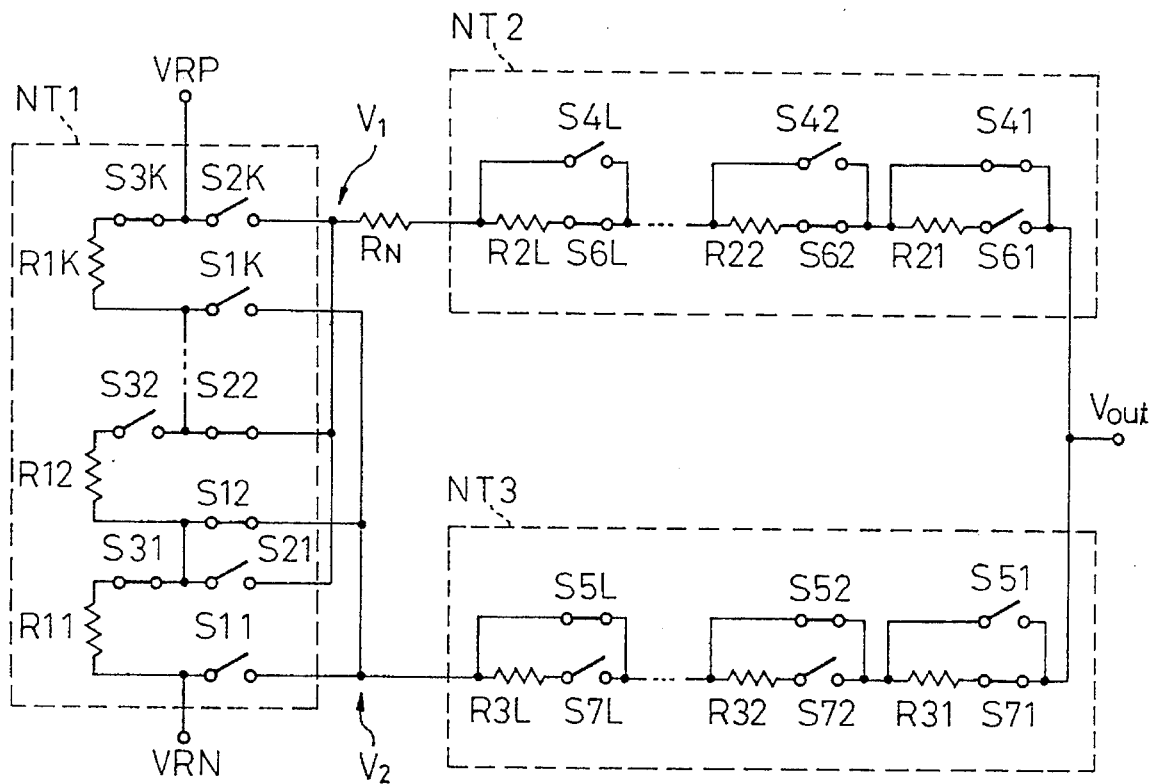
FIGS. 2A, 2B, and 2C are circuit diagrams showing a D/A converter according to a first embodiment of the present invention.
Figure 2B:
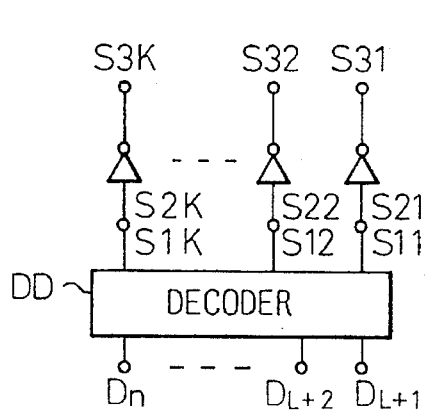
Figure 2C:
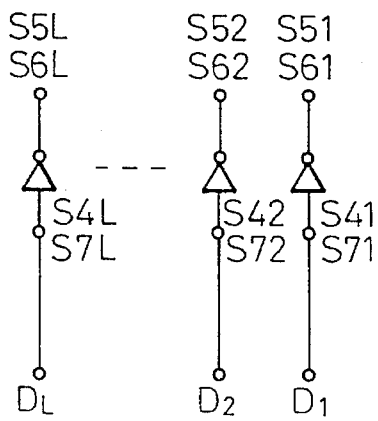

FIGS. 2A, 2B, and 2C shows a D/A converter according to a first embodiment of the present invention, and this D/A converter provides an output voltage Vout=Vin X/2" in response to the input voltage Vin and n-bit digital input X. Note that, FIG. 2A generally shows the D/A converter, and FIGS. 2B and 2C schematically show a circuit for generating signals to control switches of the D/A converter.

Referring to FIG. 2A, the D/A converter has first, second, and third partial circuits NT1, NT2, and NT3, respectively. The first partial circuit NT1 is connected with the second partial circuit NT2 through a resistor $R_N$ and is directly connected with the third partial circuit NT3. A node between the second and third partial circuits NT2 and NT3 provides an output Vout.

The first partial circuit NT1 has a first row of K resistors R11 to R1K of the same resistance value, and groups of switches S11 to S1K, S21 to S2K, and S31 to S3K provided for the resistors R11 to R1K. The second partial circuit NT2 has a second row of L resistors R21 to R2L and groups of switches S41 to S4L and S61 to S6L provided for the resistors R21 to R2L, respectively. The third partial circuit NT3 has a third row of L resistors R31 to R3L and groups of switches S51 to S5L and S71 to S7L provided for the resistors R31 to R3L, respectively.

In the second partial circuit NT2, the switches S61 to S6L are connected in series with the resistors R21 to R2L, respectively, and the switches S41 to S4L are connected in parallel with the resistors R21 to R2L and switches S61 to S6L, respectively. In the third partial circuit NT3, the switches S71 to S7L are connected in series with the resistors R31 to R3L, respectively, and the switches S51 to S5L are connected in parallel with the resistors R31 to R3L and switches S71 to S7L, respectively.

As is apparent from the comparison of FIG. 2A with FIG. 1A, the second partial circuit NT2 of this embodiment has the switches S61 to S6L connected in series with the resistors R21 to R2L, respectively, and the third partial circuit NT3 has the switches S71 to S7L connected in series with the resistors R31 to R3L, respectively.

Referring to FIG. 2C, the switches S41 to S4L, S61 to S6L, S51 to S5L, and S71 to S7L selectively short-circuit the second row of resistors R21 to R2L and the third row of resistors R31 to R3L in response to bits $D_1$ to $D_L$ of a digital input signal. The switches S11 to S1K, S21 to S2K, and S31 to S3K select "K-1" pieces of the K resistors R11 to R1K in response to bits $D_{L+1}$ to $D_n$ of the digital input signal. The selected "K-1" resistors, resistor $R_N$ second row of resistors R21 to R2L, and third row of resistors R31 to R3L are connected in series.

A reference mark VRP is a positive reference voltage (a positive reference voltage input terminal), VRN is a negative reference voltage (a negative reference voltage input terminal), and Vout is an analog output from the D/A converter. The D/A converter handles n bits with $K \cdot 2^L = 2^n$ where n is a natural number.

The operations of the D/A converter will be explained.

Referring to FIG. 2B, a decoder DD decodes higher bits $D_{L+1}$ to $D_n$ among bits $D_1$ to $D_n$ of an n-bit digital input signal, to generate signals to control the switches S11 to S1K, S21 to S2K, and S31 to S3K. The signals to control the switches S31 to S3K are inversions of the signals to control the switches S11 to S1K (S21 to S2K). As shown in FIG. 1C, signals to control the switches S51 to S5L (S61 to S6L) are inversions of signals to control the switches S41 to S4L (S71 to S7L).

The decoder DD decodes the higher bits $D_{L+1}$ to $D_n$ of the digital input signal, to provide the K signals to control the switches S11 to S1K, S21 to S2K, and S31 to S3K. These switches select locations to provide output voltages in the higher-bit circuit, i.e., the first partial circuit NT1. Higher bits of a digital input signal are decoded as shown in Table 1.

TABLE 1

| Digital input signal | | | Decoded signal | | | | | | | | |
|---|---|---|---|---|---|---|---|---|---|---|---|
| $D_n$, | ..., | $D_{L+2}$, | $D_{L+1}$ | S1K, S2K, | S1(K-1), S2(K-1), | ..., ..., | S12, S22, | S11 S21 | S3K, | S3(K-1), | ..., | S32, | S31 |
| 1, | ..., | 1, | 1 | 1, | 0, | ..., | 0, | 0 | 0, | 1, | ..., | 1, | 1 |
| ... | ... | ... | | ... | ... | ... | ... | ... | ... | ... | ... | ... | ... |
| 0, | ..., | 0, | 1 | 0, | 0, | ..., | 1, | 0 | 1, | 1, | ..., | 0, | 1 |
| 0, | ..., | 0, | 0 | 0, | 0, | ..., | 0, | 1 | 1, | 1, | ..., | 0, | 1 |

As shown in Table 1, the higher bits short-circuit the switches S1$ and S2$ ($ being one of natural numbers 1 to K) among the groups of switches S11 to S1K and S21 to S2K, and open the other switches. At the same time, inversions of the higher bits for the switches S11 to S1K and S21 to S2K open a switch S3$ among the switches S31 to S3K, and short-circuit the other switches. These operations determine locations of the higher-bit circuit, i.e., the first partial circuit NT1 to provide output voltages.

From the determined locations of the higher-bit circuit, i.e., the first partial circuit NT1, higher-bit output voltages V1 and V2 are provided. These output voltages are expressed as follows:

$$V1 = \frac{VRP - VRN}{K} \cdot Y + VRN \qquad (9)$$

$$V2 = \frac{VRP - VRN}{K} \cdot (Y - 1) + VRN$$

where, $Y \leq K$, and Y is a natural number.

The voltages V1 and V2 are provided to the lower-bit circuits, i.e., the second and third partial circuits NT2 and NT3.

The lower bits $D_1$ to $D_L$ of the digital input signal are used as they are and are inverted to generate signals to control the switches S41 to S4L, S71 to S7L, S51 to S5L, and S61 to S6L as shown in Table 2.

TABLE 2

| Digital signal | | | Decoded signal | | | | | | | | | |
| --- | --- | --- | --- | --- | --- | --- | --- | --- | --- | --- | --- | --- |
| $D_L$, | ..., | $D_2$, | $D_1$ | S4L, S7L, | S4(L-1), S7(L-1), | ..., | S42, S72, | S41 S71 | S5L, S6L, | S5(L-1), S6(L-1), | ..., | S52, S62, | S51 S61 |
| 1, | ..., | 1, | 1 | 1, 1, | 1, 1, | ..., | 1, 1, | 1 1 | 0, 0, | 0, 0, | ..., | 0, 0, | 0 0 |
| ... | ... | ... | ... | ... ... | ... ... | ... | ... ... | ... ... | ... ... | ... ... | ... | ... ... | ... ... |
| 0, | ..., | 0, | 1 | 0, 0, | 0, 0, | ..., | 0, 0, | 1 1 | 1, 1, | 1, 1, | ..., | 1, 1, | 0 0 |
| 0, | ..., | 0, | 0 | 0, 0, | 0, 0, | ..., | 0, 0, | 0 0 | 1, 1, | 1, 1, | ..., | 1, 1, | 1 1 |

The switches S4# and S7# are directly controlled by the digital input signal bits, and the switches S5# and S6# are controlled by inversions of the digital input signal bits. The reference mark # represents one of integers 1 to L.

When the resistance value of the resistors R11 to R1K is $R_K$ and the resistance values of each one of the second-row and third-row resistors are R2# and R3#, the following is established:

$$R2\#, R3\# = R_K/2^\# \quad R_N = R_K/2^L \tag{10}$$

where the resistance value $R_N$ corresponds to the resistance value of the LSB, so that the resistance value of the lower-bit circuits, i.e., the second and third partial circuits NT2 and NT3 and the resistor $R_N$ is equal to the resistance value $R_K$ irrespective of changes in the input signal.

Accordingly, the analog output Vout is expressed as follows:

$$V\text{out} = \frac{V1 - V2}{2^L}(Z-1) + V2 \tag{11}$$

where, $Z \leq 2^L$, and Z is a natural number.

The equations (9) and (11) provide the following:

$$V\text{out} = \frac{VRP - VRN}{K}\left(Y - 1 + \frac{Z-1}{2^L}\right) + VRN \tag{12}$$

When $X = (Y-1)2^L + Z - 1$, $K \cdot 2^L = 2^n$, so that the digital input X takes the following value:

$$0 \leq X \leq 2^n - 1 \tag{13}$$

Accordingly, the circuit of this embodiment operates as an n-bit D/A converter that provides an analog output Vout in response to a digital input X as follows:

$$V\text{out} = (VRP - VRN)\frac{X}{2^n} + VRN \tag{14}$$

Figure 3A:
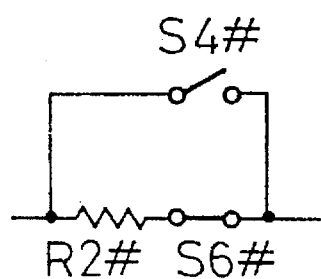
FIGS. 3A and 3B are diagrams for explaining the operations of the D/A converter shown in FIGS. 2A to 2C.
Figure 3B:
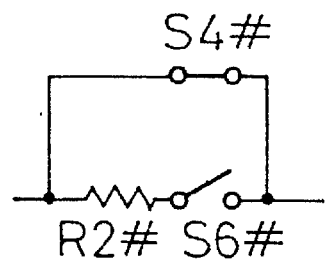

FIGS. 3A and 3B explain the operations of the D/A converter shown in FIGS. 2A to 2C. Note that, FIG. 3A shows a switch S4# that is open and a switch S6# that is short-circuited, and FIG. 3B shows the switch S4# that is short-circuited and the switch S6# that is open.

As explained above, the switches S61 to S6L (S6#) are connected in series with the second row of resistors R21 to R2L (R2#), respectively, in the second partial circuit NT2. Similarly, the switches S71 to S7L (S7#) are connected in series with the third row of resistors R31 to R3L (R3#), respectively, in the third partial circuit NT3. When the switch S4# is opened, the switch S6# is short-circuited, and when the switch S4# is short-circuited, the switch S6# is opened. Consequently, the ON resistance of the switches S4# to S7# is not required to be much smaller than the resistance of the resistor R2#.

When the switch S4# is opened and the switch S6# is short-circuited as shown in FIG. 3A, a combined resistance value RON is as follows:

$$RON = R4\# + r \tag{15}$$

where r is the ON resistance of the switch.

When the switch S4# is short-circuited and the switch S6# is opened as shown in FIG. 3B, a combined resistance value ROFF is as follows:

$$ROFF = r \tag{16}$$

Accordingly, the following is established:

$$RON - ROFF = R4\# \tag{17}$$

Namely, the difference between the combined resistance values of FIGS. 3A and 3B is R4# irrespective of the ON resistance r. This means that the ON resistance value r can be optionally determined to minimize the size of a transistor served as a switch.

As explained above, this embodiment achieves the same function as the prior art while reducing a cell area. According to the prior art, the ON resistance of a switch must be sufficiently lower (for example, 1/100) than that of a resistor connected in parallel with the switch. On the other hand, the present invention is irrelevant to the ON resistance of a switch.

For example, the ON resistance of a switch may be 1/10 of that of a resistor connected in parallel with the switch. The size of a FET served as a switch is inversely proportional to the ON resistance of the switch. Accordingly, the size of a switch according to the present invention will be about 1/10 of that of the prior art. Although the number of switches in the second and third partial circuits NT2 and NT3 of the D/A converter of the present invention is twice that of the prior art, area for the switches is about 2/10 of the prior art.

Figure 4A:
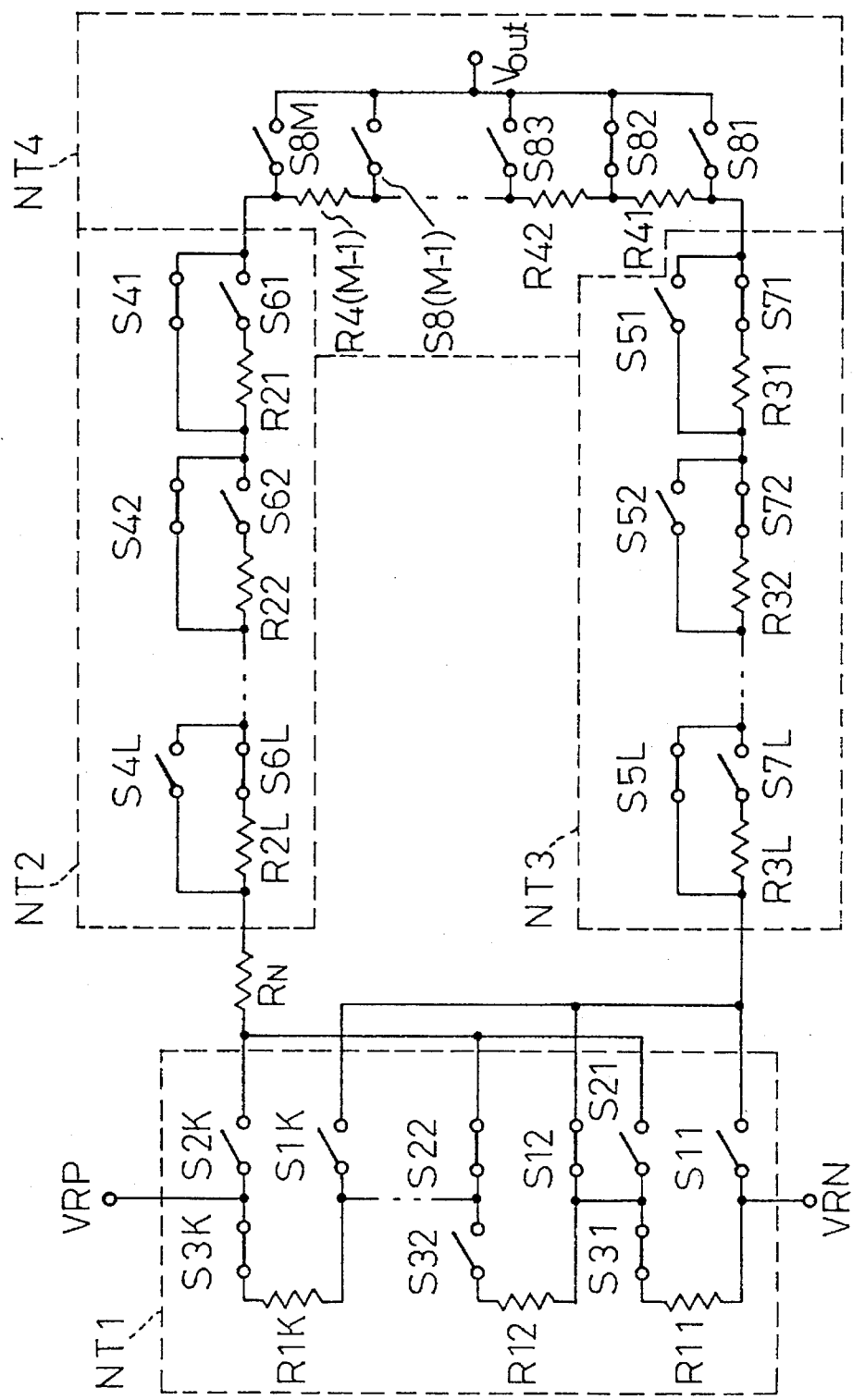
FIGS. 4A, 4B, 4C, and 4D are circuit diagrams showing a D/A converter according to a second embodiment of the present invention.
Figure 4B:
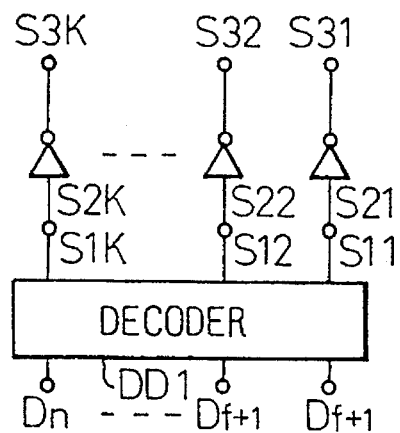
Figure 4C:
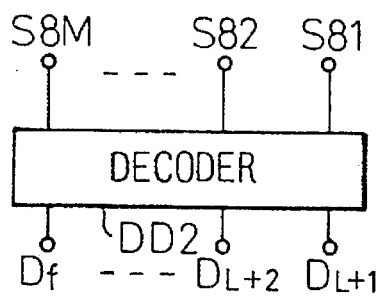
Figure 4D:
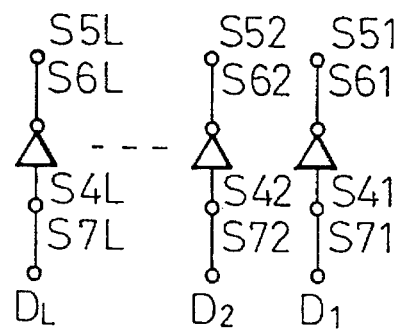

FIGS. 4A, 4B, 4C, and 4D are circuit diagrams showing a D/A converter according to a second embodiment of the present invention. Note that, FIG. 4A generally shows the D/A converter, and FIGS. 4B, 4C, and 4D schematically show circuits for generating signals to control switches of the D/A converter.

As is apparent from the comparison of FIG. 4A with FIG. 2A, the second embodiment connects a fourth partial circuit NT4 in series between the second and third partial circuits NT2 and NT3 of the first embodiment. The fourth partial circuit NT4 has "M-1" resistors R41 to R4(M-1) of the same resistance value connected in series, and M switches S81 to S8M for connecting one of M ends of the resistors to an output terminal.

Referring to FIG. 4B, a decoder DD1 decodes higher bits $D_{f+1}$ to $D_n$ among bits $D_1$ to $D_n$ of an n-bit digital input signal and provides signals to control switches S11 to S1K, S21 to S2K, and S31 to S3K. The signals to control the switches S31 to S3K are inversions of the signals to control the switches S11 to S1K and S21 to S2K. Referring to FIG. 4C, a decoder DD2 decodes intermediate bits $D_{L+1}$ to $D_f$ among the bits $D_1$ to $D_n$ of the n-bit digital input signal and provides signals to control the switches S81 to S8M. Referring to FIG. 4D, lower bits $D_1$ to $D_f$ among the bits $D_1$ to $D_n$ of the n-bit digital input signal are used as they are and are inverted to control switches S41 to S4L, S71 to S7L, S51 to S5L, and S61 to S6L.

The resistance value RM of the each resistor of the fourth partial circuit NT4 is expressed as follows:

$$R_M = R_K/M \tag{18}$$

The resistance value of each resistor in the second and third partial circuits NT2 and NT3 is expressed as follows:

$$R2\#, R3\# = R_M/2^\# \tag{19}$$

The first partial circuit NT1 is a higher-bit circuit, the fourth partial circuit NT4 is an intermediate-bit circuit, and the second and third partial circuits NT2 and NT3 are lower-bit circuits. The D/A converter handles n input bits with $K \cdot M \cdot 2^L = 2^n$. Since the second embodiment divides input bits into three groups, the embodiment is advantageous when the number of bit n is large.

Figure 5A:
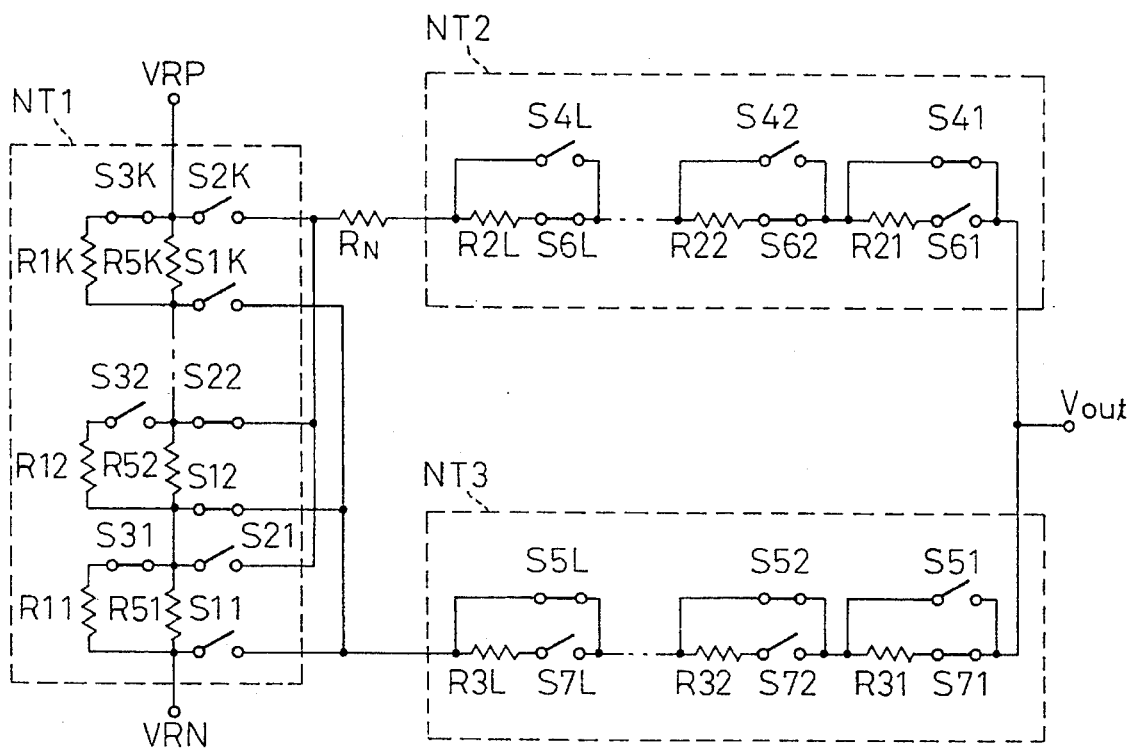
FIGS. 5A, 5B, and 5C are circuit diagrams showing a D/A converter according to a third embodiment of the present invention.
Figure 5B:
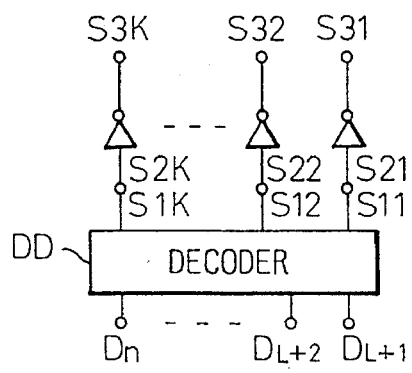
Figure 5C:
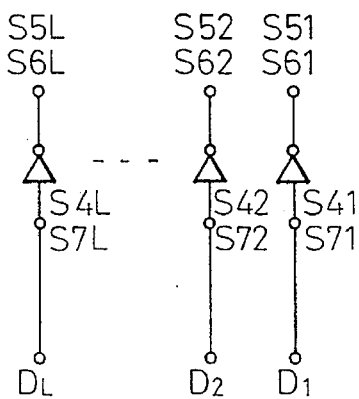

FIGS. 5A, 5B, and 5C are circuit diagrams showing a D/A converter according to a third embodiment of the present invention. Note that, FIG. 5A generally shows the D/A converter, and FIGS. 5B and 5C schematically show a circuit for generating signals to control switches of the D/A converter.

As is apparent from the comparison of FIG. 5A with FIG. 2A, the third embodiment employs resistors R51 to R5K connected in parallel with the series-connected resistors R11 to R1K and switches S31 to S3K of the first partial circuit NT1 of the first embodiment. Referring to FIG. 5A, the resistors R51 to R5K are connected in series. Ends of a resistor R5# are connected with ends of a series-connected R1# and S3#, respectively. Ends of the series-connected resistors R51 to R5K receive a positive reference voltage VRP and a negative reference voltage VRN, respectively. The resistors R51 to R5K have each the same resistance value, which is sufficiently smaller than the resistance value $R_K$ of the resistors R11 to R1K.

An advantage of the resistors R51 to R5K of the third embodiment will be explained.

Each node of a D/A converter is actually coupled with a parasitic capacitor. When switches of the D/A converter are turned ON and OFF, or when the D/A converter is started by changing the digital input value, some parasitic capacitors are charged and some are discharged. To charge the parasitic capacitors, a given time is needed.

According to the third embodiment, a current flows through the resistors R51 to R5K, to quickly charge the parasitic capacitors. This results in reducing the RC time constant of the D/A converter. The D/A converter of the third embodiment of FIGS. 5A to 5C also quickly follows changes in the positive reference voltage VRP and negative reference voltage VRN.

In some application, the positive reference voltage VRP is connected with an analog input signal, and the negative reference voltage VRN is grounded. In this case, a current passing through the D/A converter varies in response to a change in the positive reference voltage VRP. Since the third embodiment quickly charges and discharges parasitic capacitors, it quickly follows the change in the positive reference voltage VRP.

Figure 6A:
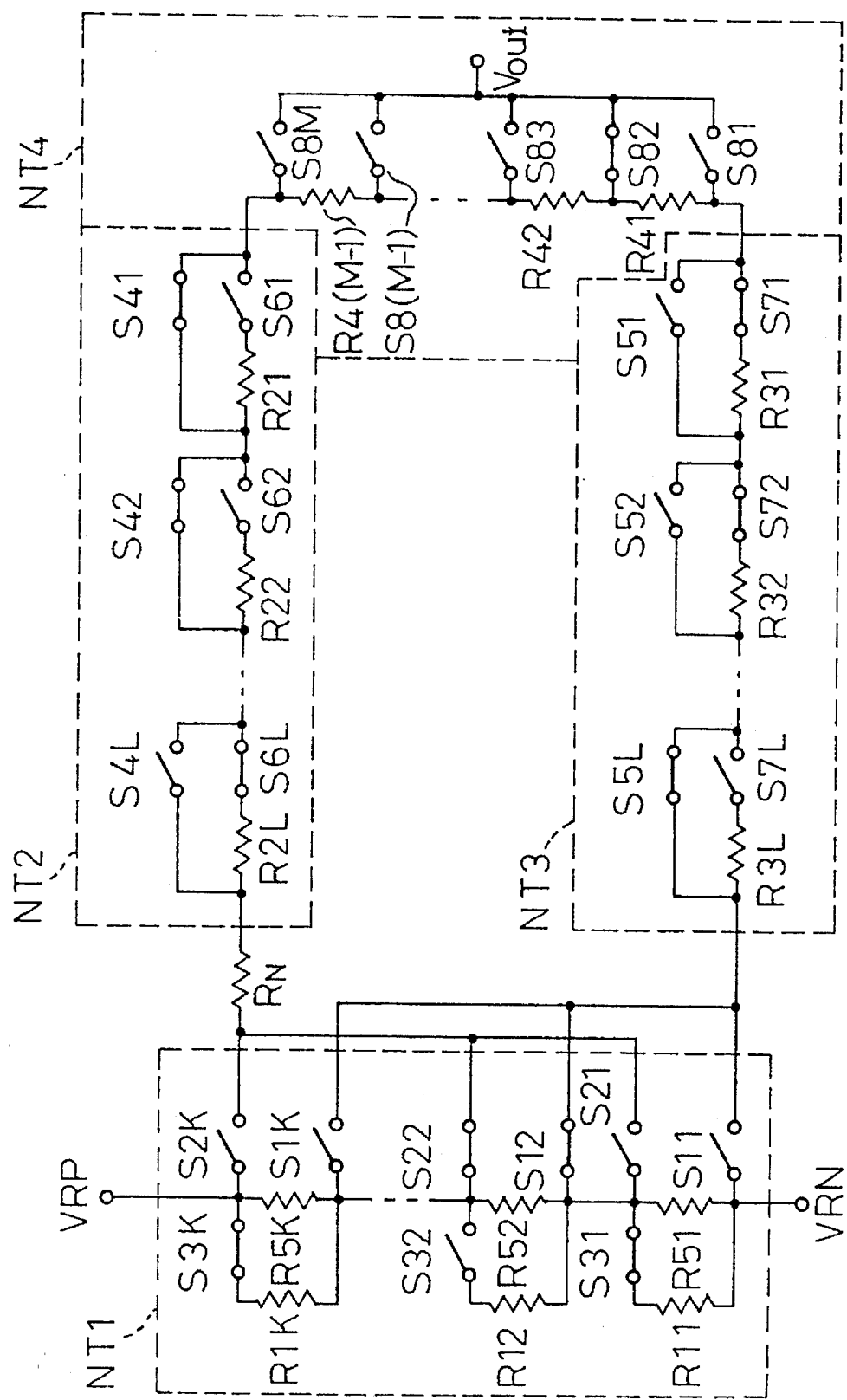
FIGS. 6A, 6B, 6C, and 6D are circuit diagrams showing a D/A converter according to a fourth embodiment of the present invention.
Figure 6B:
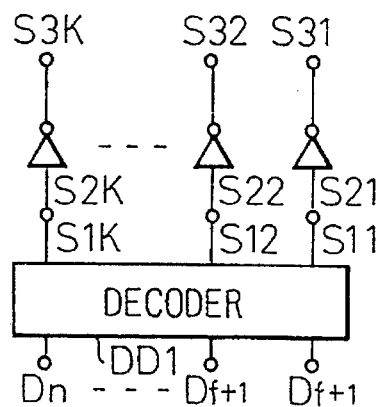
Figure 6C:
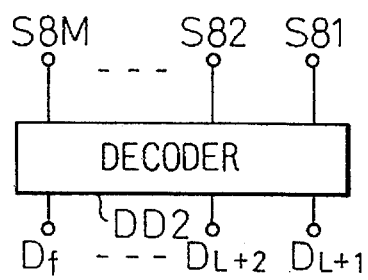
Figure 6D:
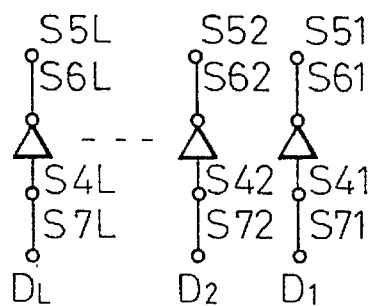

FIGS. 6A, 6B, 6C, and 6D are circuit diagrams showing a D/A converter according to a fourth embodiment of the present invention. Note that, FIG. 6A generally shows the D/A converter, and FIGS. 6B, 6C, and 6D schematically show circuits for generating signals to control switches of the D/A converter.

As is apparent from the comparison of FIG. 6A with FIGS. 4A and 5A, the fourth embodiment is a combination of the second and third embodiments. Namely, a fourth partial circuit NT4 is connected in series between second and third partial circuits NT2 and NT3, and resistors R51 to R5K are connected in parallel with the series-connected resistors R11 to R1K and switches S31 to S3K of the first partial circuit NT1 of the first embodiment.

Figure 7A:
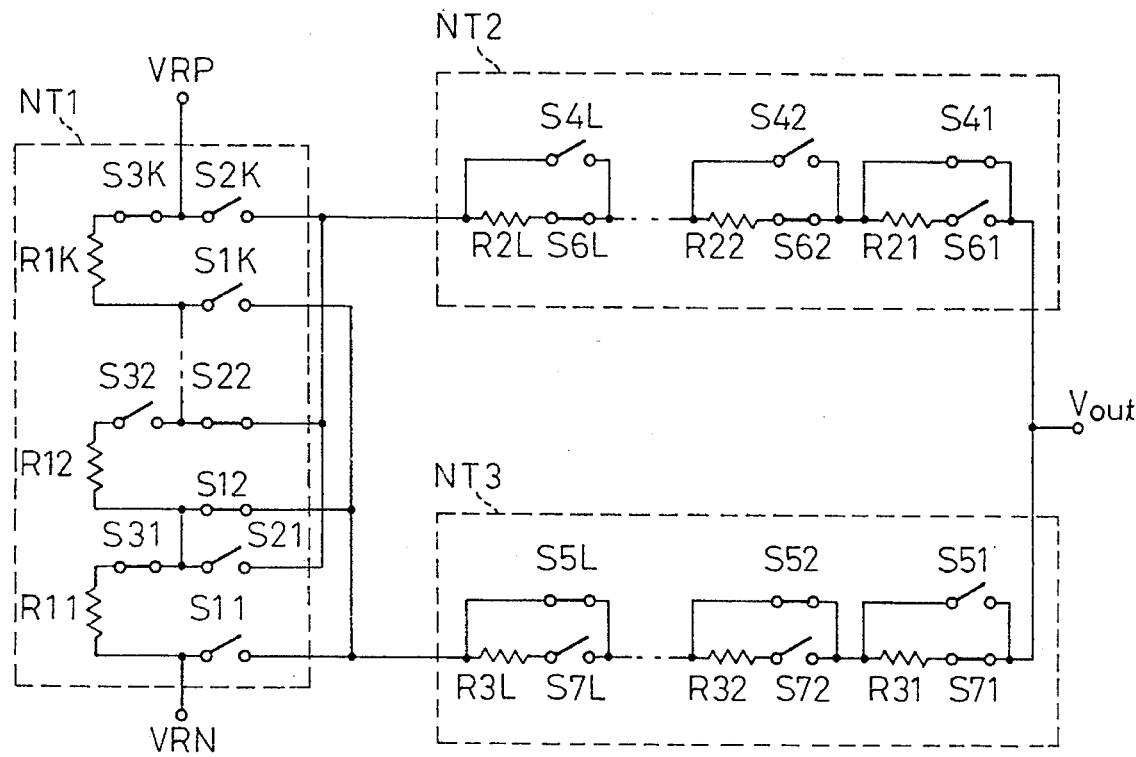
FIGS. 7A, 7B, and 7C are circuit diagrams showing a D/A converter according to a fifth embodiment of the present invention.
Figure 7B:
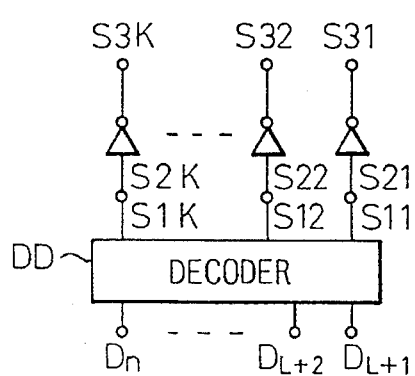
Figure 7C:
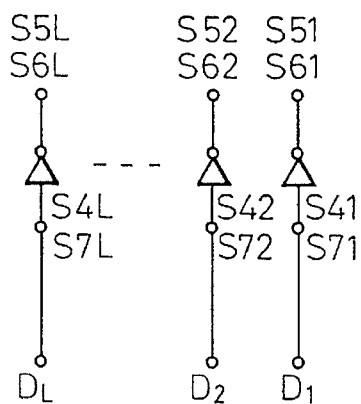

FIGS. 7A, 7B, and 7C are circuit diagrams showing a D/A converter according to a fifth embodiment of the present invention. Note that, FIG. 7A generally shows the D/A converter, and FIGS. 7B and 7C schematically show a circuit for generating signals to control switches of the D/A converter.

As is apparent from the comparison of FIG. 7A with FIG. 2A, the fifth embodiment is identical to the first embodiment except the resistor $R_N$ for generating a voltage drop for the LSB. Namely, the fifth embodiment directly connects the first partial circuit NT1 to the second partial circuit NT2 without the resistor $R_N$. Instead of the resistor $R_N$, the fifth embodiment uses the ON resistance of switches S4# to S7# of the second and third partial circuits NT2 and NT3. Since there is no resistor $R_N$, the fifth embodiment needs a smaller occupying area.

Using the ON resistance of switches S4# to S7# of the second and third partial circuits NT2 and NT3 instead of the resistor $R_N$ will be explained. In this case, the first partial circuit NT1 is short-circuited to the second partial circuit NT2 without the resistor $R_N$.

When the ON resistance is zero, a condition 1 defines higher bits of a digital input signal as taking a value X and lower bits thereof as taking each 1, and a condition 2 defines higher bits of a digital input signal as taking a value X+1 and lower bits thereof as taking each 0. A difference in an output voltage Vout between the conditions 1 and 2 is expressed as follows with the resistance value of the first partial circuit NT1 being $KR_K$ and the total resistance value of the second and third partial circuits NT2 and NT3 being R:

Condition 1:

$$V_{out} = \frac{XR_K + R}{KR_K}(VRP - VRN) \tag{20}$$

$$= \frac{(X+1)R_K}{KR_K}(VRP - VRN)$$

Condition 2:

$$V_{out} = \frac{(X+1)R_K}{KR_K}(VRP - VRN) \tag{21}$$

where:

$$R = \frac{R_L}{2^1} + \frac{R_L}{2^2} + \ldots + \frac{R_L}{2^L} \tag{22}$$

$$R = R_K \tag{23}$$

Namely, the difference of the output voltage Vout between the conditions 1 and 2 is zero.

When the ON resistance r of a switch is large to some extent, the potential difference in the output voltage Vout between the conditions 1 and 2 will be as follows:

Condition 1:

$$V_{out} = \frac{XR_K + R + Lr}{KR_K}(VRP - VRN) \quad (24)$$

$$= \frac{(X+1)R_K + Lr}{KR_K}(VRP - VRN)$$

Condition 2:

$$V_{out} = \frac{(X+1)R_K + Lr}{KR_K}(VRP - VRN) \quad (25)$$

where:

$$R = \frac{R_L}{2^1} + \frac{R_L}{2^2} + \ldots + \frac{R_L}{2^L} \quad (26)$$

$$R + 2L \cdot r = R_K \quad (27)$$

Accordingly, the difference of the output voltage Vout between the conditions 1 and 2 corresponds to a resistance value of 2L·r. Namely, the ON resistance can be used as the resistor $R_N$ by changing the size of each FET served as a switch, to realize the following relationship:

$$2L \cdot r = R_N \quad (28)$$

Figure 8A:
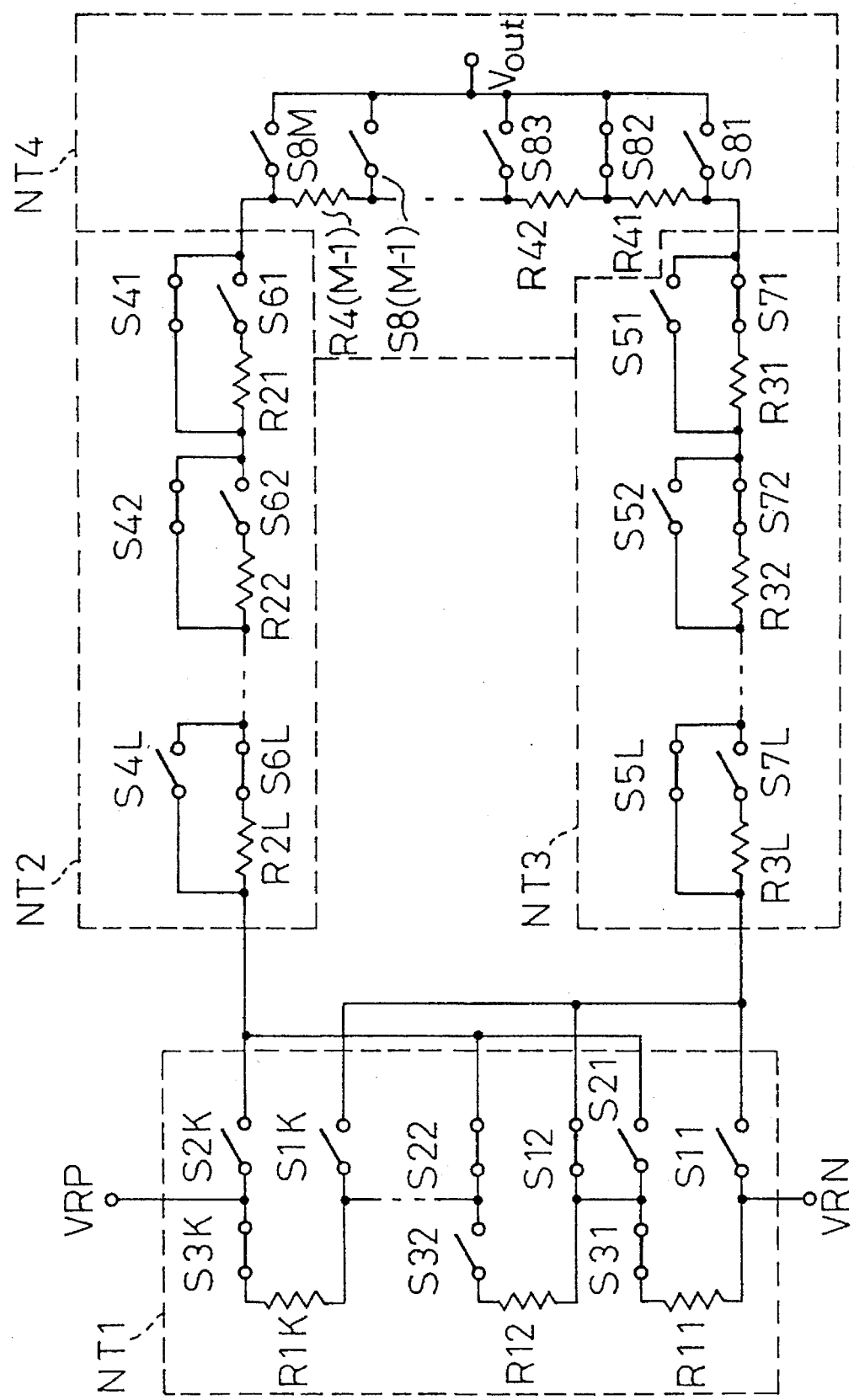
FIGS. 8A, 8B, 8C, and 8D are circuit diagrams showing a D/A converter according to a sixth embodiment of the present invention.
Figure 8B:
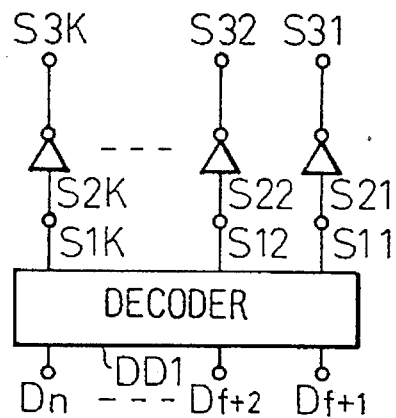
Figure 8C:
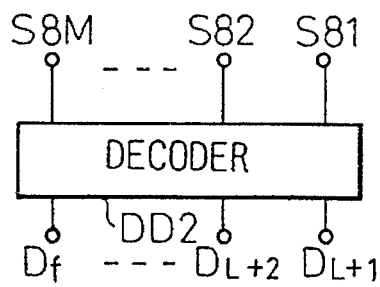
Figure 8D:
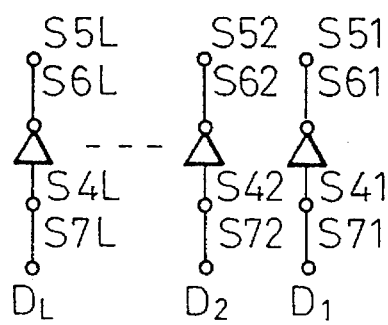

FIGS. 8A, 8B, 8C, and 8D are circuit diagrams showing a D/A converter according to a sixth embodiment of the present invention. Note that, FIG. 8A generally shows the D/A converter, and FIGS. 8B, 8C, and 8D schematically show circuits for generating signals to control switches of the D/A converter.

As is apparent in FIG. 8A, the sixth embodiment is a combination of the second embodiment of FIG. 4A and the fifth embodiment of FIG. 7A. The resistor $R_N$ of the second embodiment is omitted in the sixth embodiment. Compared with the first embodiment, the sixth embodiment divides input bits into three groups. Accordingly, this embodiment is appropriate when the number of input bits is large. Since the resistor $R_N$ is not needed, the sixth embodiment is capable of further reducing its occupying area.

Figure 9A:
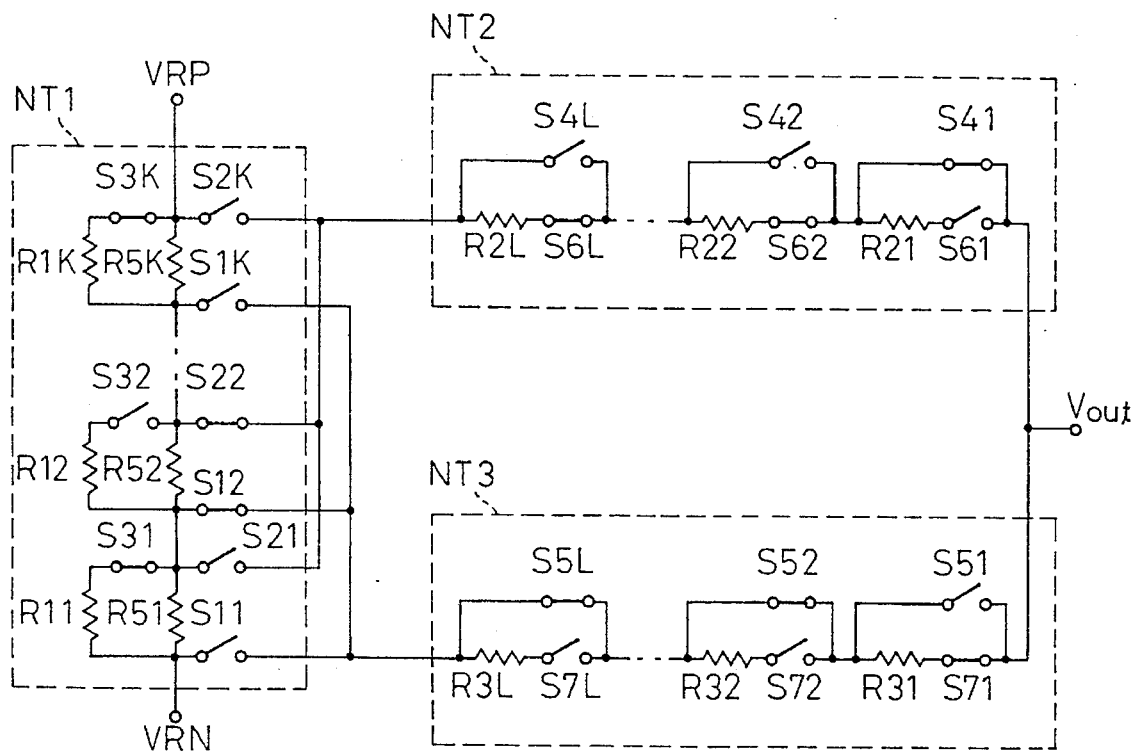
FIGS. 9A, 9B, and 9C are circuit diagrams showing a D/A converter according to a seventh embodiment of the present invention.
Figure 9B:
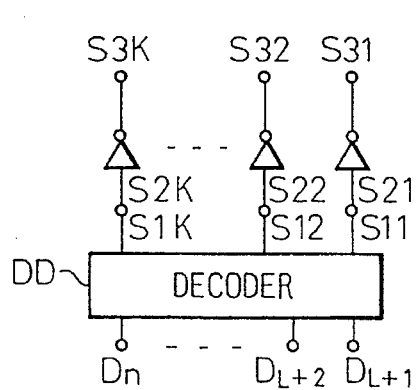
Figure 9C:
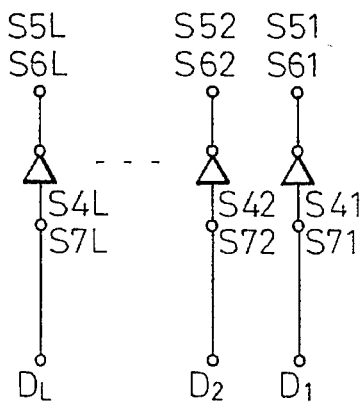

FIGS. 9A, 9B, and 9C are circuit diagrams showing a D/A converter according to a seventh embodiment of the present invention. Note that, FIG. 9A generally shows the D/A converter, and FIGS. 9B and 9C schematically show a circuit for generating signals to control switches of the D/A converter.

As is apparent in FIG. 9A, the seventh embodiment is a combination of the third embodiment of FIG. 5A and the fifth embodiment of FIG. 7A. The resistor $R_N$ of the third embodiment is omitted in the seventh embodiment. Compared with the first embodiment, the seventh embodiment quickly charges and discharges parasitic capacitors and follows changes in the positive reference voltage VRP. Since the resistor $R_N$ is not needed, the seventh embodiment is small in an occupying area.

Figure 10A:
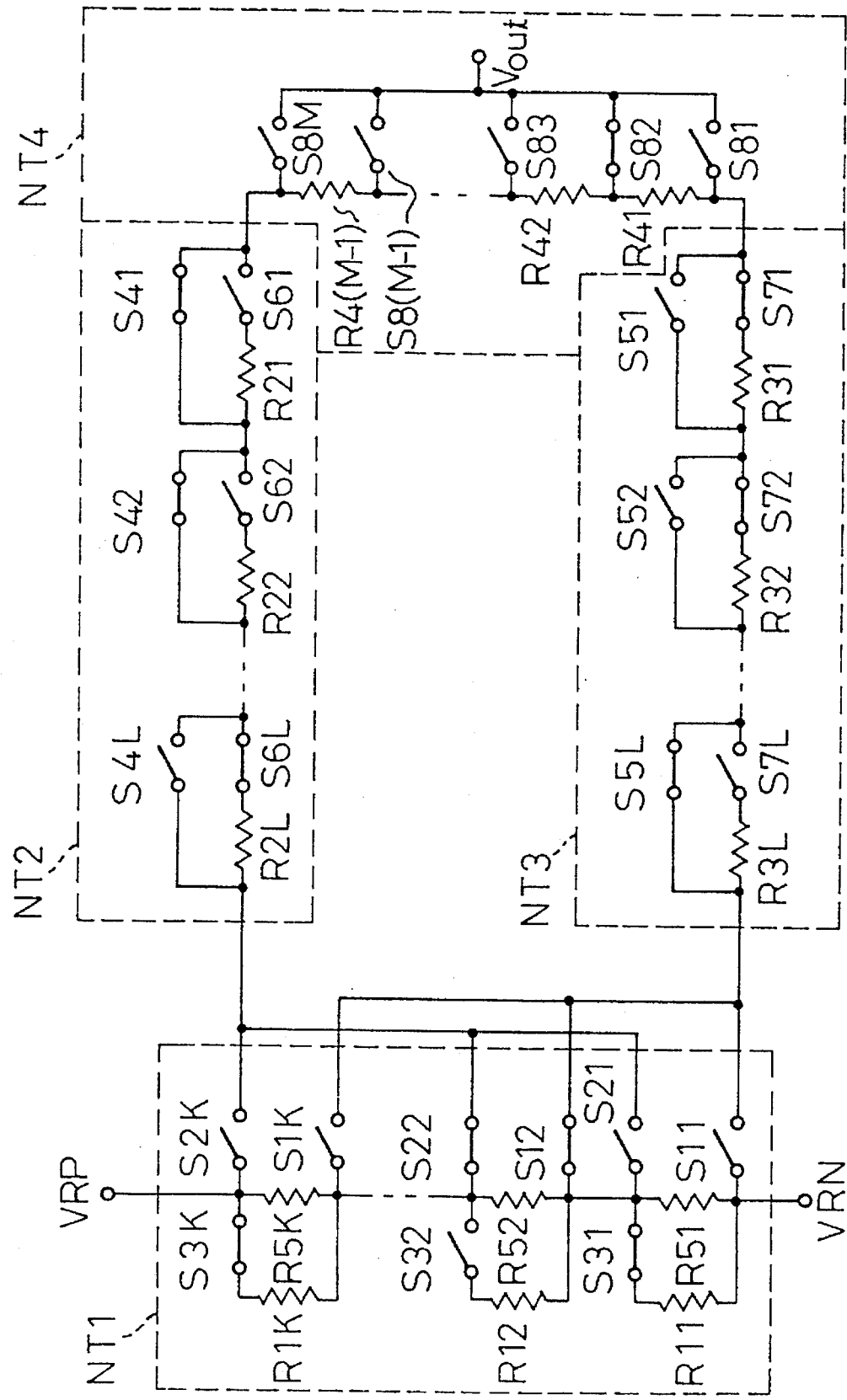
FIGS. 10A, 10B, 10C, and 10D are circuit diagrams showing a D/A converter according to an eighth embodiment of the present invention.
Figure 10B:
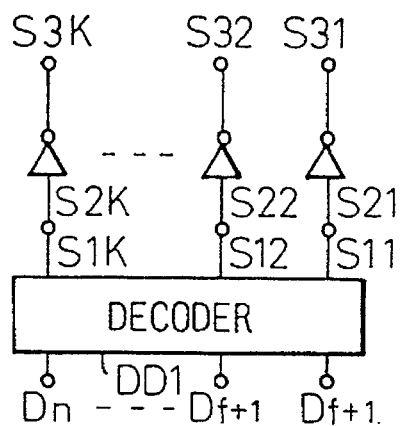
Figure 10C:
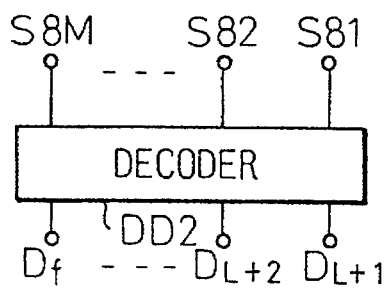
Figure 10D:
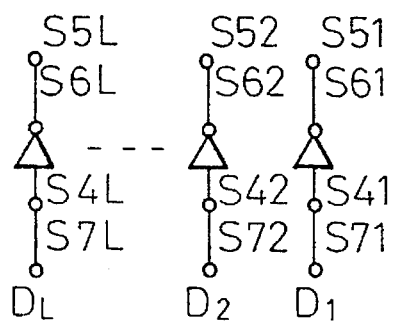

FIGS. 10A, 10B, 10C, and 10D are circuit diagrams showing a D/A converter according to an eighth embodiment of the present invention. Note that, FIG. 10A generally shows the D/A converter, and FIGS. 10B, 10C, and 10D schematically show circuits for generating signals to control switches of the D/A converter.

As is apparent in FIG. 10A, the eighth embodiment is a combination of the second embodiment of FIG. 4A and the seventh embodiment of FIG. 9A. Namely, the eighth embodiment connects a fourth partial circuit NT4 in series between the second and third partial circuits NT2 and NT3 of the seventh embodiment. The eighth embodiment provides a combination of the effects of the second and seventh embodiments.

Figure 11A:
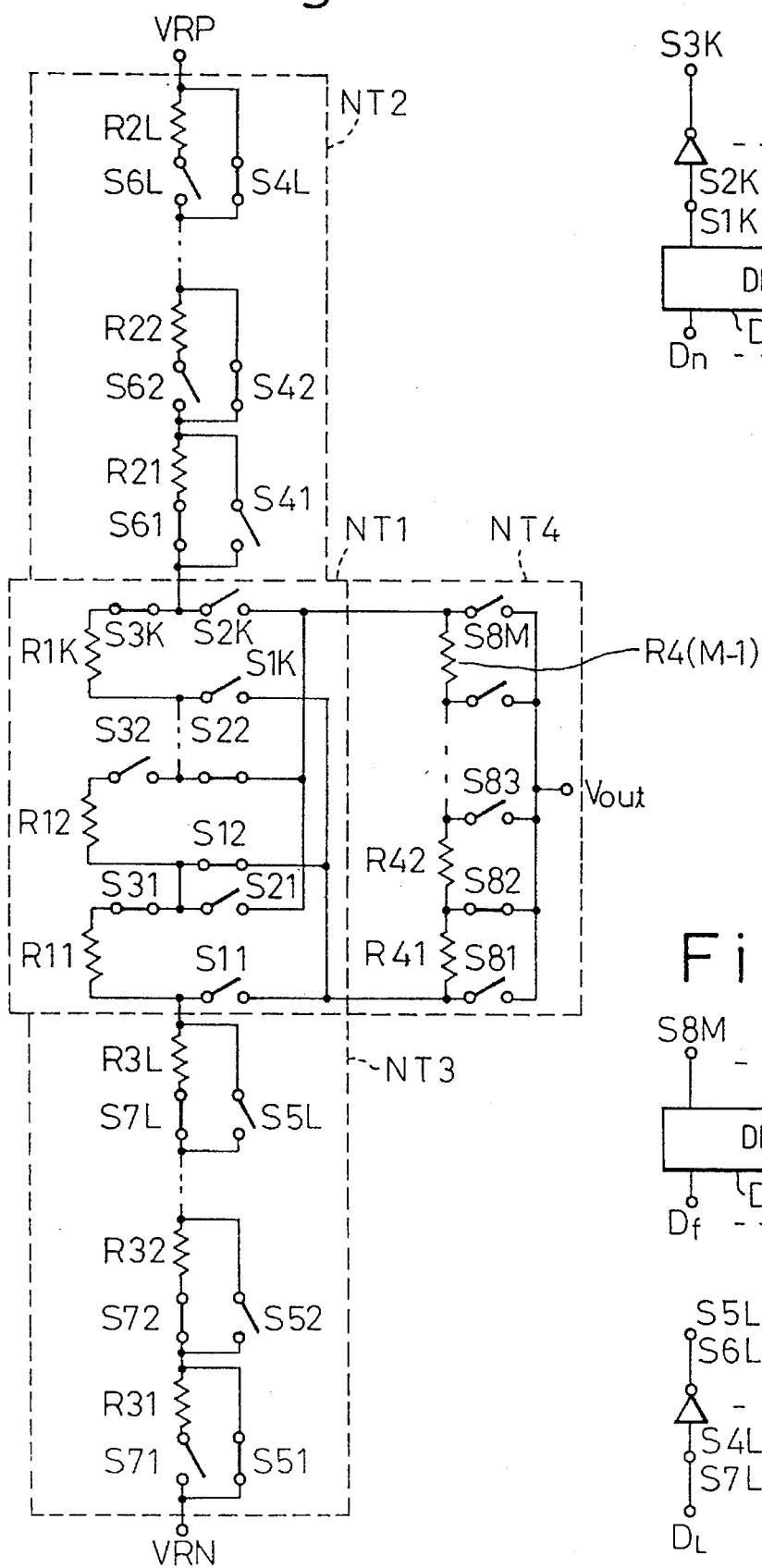
FIGS. 11A, 11B, and 11C are circuit diagrams showing a D/A converter according to a ninth embodiment of the present invention.
Figure 11B:
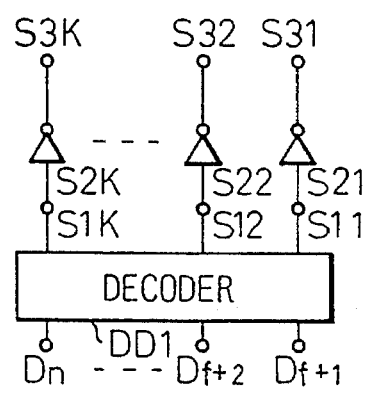
Figure 11C:
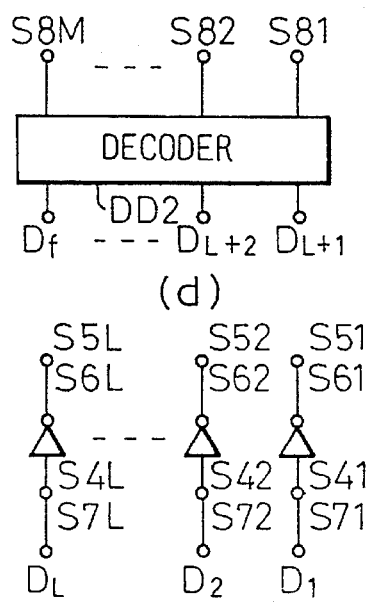

FIGS. 11A, 11B, and 11C are circuit diagrams showing a D/A converter according to a ninth embodiment of the present invention. Note that, FIG. 11A generally shows the D/A converter, and FIGS. 11B, 11C, and 11D schematically show circuits for generating signals to control switches of the D/A converter.

As is apparent in FIG. 11A, the ninth embodiment removes the second partial circuit NT2 from the sixth embodiment of FIG. 8A, to short-circuit the first and fourth partial circuits to each other, connects the second partial circuit NT2 in series between the positive reference voltage input terminal VRP and the first partial circuit (the first row of resistors) NT1, removes the third partial circuit NT3, to short-circuit the first and fourth partial circuits to each other, and connects the third partial circuit NT3 in series between the negative reference voltage input terminal VRN and the first row of resistors. This arrangement minimizes a change in the ON resistance of a switch corresponding to the LSB.

Generally, the ON resistance of a switch varies depending on a voltage applied thereto. The resistance value of the second and third partial circuits NT2 and NT3 is sufficiently smaller than that of the first partial circuit NT1, so that a voltage drop in the second and third partial circuits NT2 and NT3 is small.

On the other hand, the ninth embodiment causes little change in voltages applied to the partial circuits NT1 to NT4, so that a change in a voltage applied to a switch is also little. Accordingly, a change in the ON resistance is also little, to provide an accurate D/A converter.

Figure 12A:
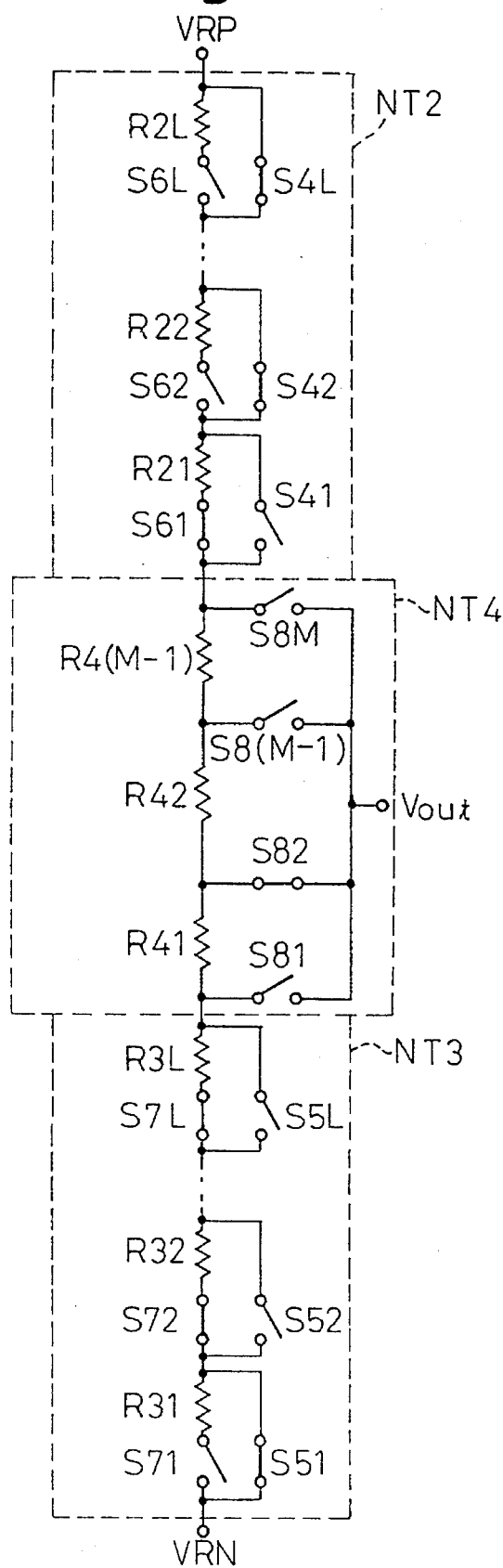
FIGS. 12A, 12B, and 12C are circuit diagrams showing a D/A converter according to a tenth embodiment of the present invention.
Figure 12B:
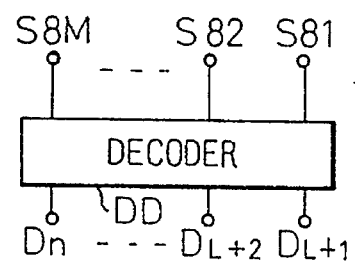
Figure 12C:
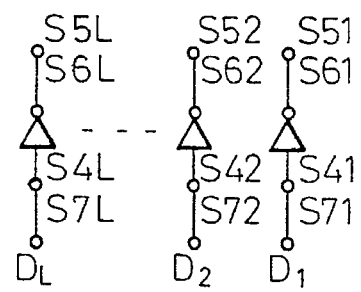

FIGS. 12A, 12B, and 12C are circuit diagrams showing a D/A converter according to a tenth embodiment of the present invention. Note that, FIG. 12A generally shows the D/A converter, and FIGS. 12B and 12C schematically show a circuit for generating signals to control switches of the D/A converter.

As shown in FIG. 12A, the tenth embodiment arranges a fourth partial circuit NT4, instead of the first partial circuit NT1 of the ninth embodiment of FIG. 11A, between second and third partial circuits NT2 and NT3. Accordingly, a positive reference voltage input terminal VRP, the second partial circuit NT2, fourth partial circuit NT4, third partial circuit NT3, and a negative reference voltage input terminal VRN are connected in series in this order. The effect of the tenth embodiment is basically the same as that of the ninth embodiment. The tenth embodiment reduces a change in ON resistance and provides an accurate D/A converter.

As explained above in detail, the present invention reduces an area occupied by a D/A converter and increases the number of D/A converter chips to be fabricated on a wafer, to thereby reduce the costs of the D/A converters.

Many different embodiments of the present invention may be constructed without departing from the spirit and scope of the present invention, and it should be understood that the present invention is not limited to the specific embodiments described in this specification, except as defined in the appended claims.

What is claimed is:

1. A digital-to-analog converter for providing an analog output according to a digital input signal, comprising:

a first partial circuit, disposed between a first reference voltage input terminal and a second reference voltage input terminal, having a first row of K resistors of the same resistance value and groups of switches provided for the resistors, to select "K-1" resistors among said K resistors;

a second partial circuit, connected with said first partial circuit, having a second row of L resistors, a first group of switches connected in series with said resistors, respectively, and a second group of switches connected in parallel with said series-connected second row of resistors and said first group of switches, respectively; and a third partial circuit, connected with said first partial circuit, having a third row of L resistors, a third group of switches connected in series with said resistors, respectively, and a fourth group of switches connected in parallel with said series-connected third row of resistors and said third group of switches, respectively.

2. A digital-to-analog converter as claimed in claim 1, wherein said selected "K-1" resistors among said K resistors are connected in series with said second and third partial circuits.

3. A digital-to-analog converter as claimed in claim 1, wherein said groups of switches of said first partial circuit are controlled by higher bits of said digital input signal, and said first and second groups of switches of said second partial circuit and said third and fourth groups of switches of said third partial circuit are controlled by lower bits of said digital input signal.

4. A digital-to-analog converter as claimed in claim 3, wherein the signals to control said first and fourth groups of switches are inversions of the signals to control said second and third groups of switches.

5. A digital-to-analog converter as claimed in claim 1, wherein an output terminal for providing the analog output is arranged at a node between said second partial circuit and said third partial circuit.

6. A digital-to-analog converter as claimed in claim 1, wherein said digital-to-analog converter further comprises a fourth partial circuit arranged between said second partial circuit and said third partial circuit, said fourth partial circuit having a fourth row of series-connected "M-1" resistors of the same resistance value and a fifth group of switches for selectively short-circuiting M ends of said resistors with respect to said output terminal for providing the analog output.

7. A digital-to-analog converter as claimed in claim 6, wherein said fifth group of switches of said fourth partial circuit are controlled by intermediate bits of the digital input signal.

8. A digital-to-analog converter as claimed in claim 1, wherein said first partial circuit has resistors connected in parallel with said first-row resistors, respectively.

9. A digital-to-analog converter as claimed in claim 1, wherein said digital-to-analog converter further comprises a resistor having a predetermined resistance value and arranged between said first partial circuit and said second partial circuit.

10. A digital-to-analog converter as claimed in claim 1, wherein said first partial circuit is directly connected with said second partial circuit, so that the ON resistance of said groups of switches of said second and third partial circuits provides a predetermined resistance value between said first and second partial circuits.

11. A digital-to-analog converter as claimed in claim 1, wherein said second partial circuit is arranged between said first partial circuit and said first reference voltage input terminal, and said third partial circuit is arranged between said first partial circuit and said second reference voltage input terminal.

12. A digital-to-analog converter as claimed in claim 11, wherein said digital-to-analog converter further comprises a fourth partial circuit served as said first partial circuit, said fourth partial circuit having a fourth row of series-connected M-1 resistors of the same resistance value and a fifth group of switches for selectively short-circuiting M ends of said resistors with respect to an output terminal for providing the analog output.

* * * * *